United States Patent
Zhang et al.

(10) Patent No.: US 7,386,182 B2
(45) Date of Patent: Jun. 10, 2008

(54) OPTIMIZATION OF MULTIPLE FEATURE LITHOGRAPHY

(75) Inventors: Gary Guohong Zhang, Plano, TX (US); Changan Wang, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 595 days.

(21) Appl. No.: 10/987,406

(22) Filed: Nov. 12, 2004

(65) Prior Publication Data

US 2006/0107249 A1     May 18, 2006

(51) Int. Cl.
*G06K 9/40*     (2006.01)
(52) U.S. Cl. .................... 382/254; 257/E21.023; 257/E21.206; 257/E21.24
(58) Field of Classification Search ............ 216/85, 216/87, 94; 257/98, 432, 435, E21.023, 257/E21.031, E21.032, E21.206, E21.24, 257/E21.487; 378/34, 35; 382/254
See application file for complete search history.

(56) References Cited

U.S. PATENT DOCUMENTS

| | | | | |
|---|---|---|---|---|
| 5,835,227 A | * | 11/1998 | Grodnensky et al. | ....... 356/399 |
| 2004/0096752 A1 | * | 5/2004 | Liebmann et al. | ............. 430/5 |
| 2004/0156030 A1 | * | 8/2004 | Hansen | ........................ 355/67 |

* cited by examiner

*Primary Examiner*—Matthew C. Bella
*Assistant Examiner*—Gregory F Cunningham
(74) *Attorney, Agent, or Firm*—Rose Alyssa Keagy; W. James Brady, III; Frederick J. Telecky, Jr.

(57) ABSTRACT

According to one embodiment of the invention, a method for enhancing multiple feature lithography is provided. The method includes generating a plurality of maps each associated with a particular one of a plurality of circuit features. Each map maps an illumination field comprising a plurality of point sources and indicates, in terms of a process metric and for each point source, a level of feature quality that will result from using the each point source to image the each circuit feature. The method also includes identifying, based on the maps, a group of one or more of the point sources that, if used to image the circuit features onto a target surface, will result in an overall feature quality level equal to or greater than a predetermined quality threshold.

18 Claims, 6 Drawing Sheets

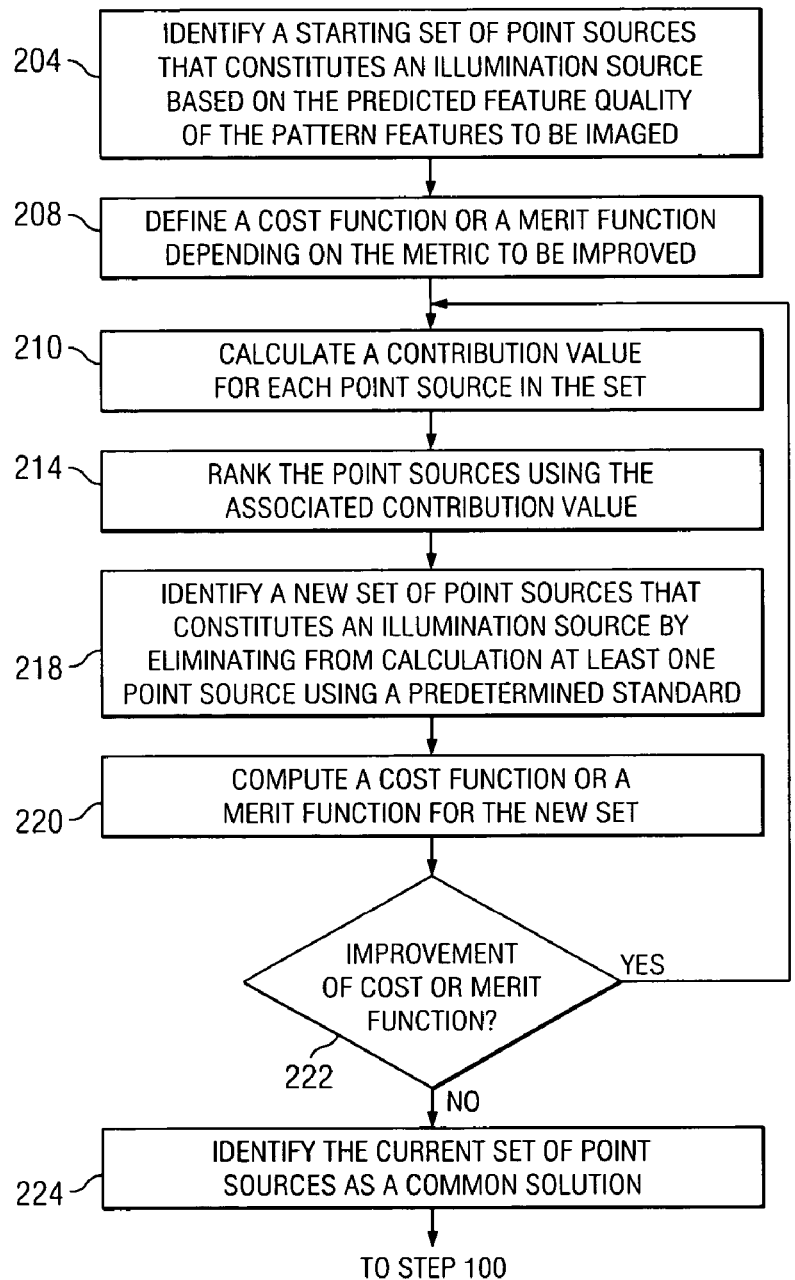

OPTIMIZATION OF MULTIPLE FEATURE LITHOGRAPHY

TECHNICAL FIELD OF THE INVENTION

This invention relates generally to electronics fabrication and more particularly to optimization of multiple feature lithography.

BACKGROUND OF THE INVENTION

Miniaturization is a challenge for manufacturers of electronic products. To build smaller electronic products, the components of the electronic products may also require miniaturization. Thus, manufacturers of electronic components, such as integrated circuit (IC) chips, are under constant pressure to increase the density of features in a given area of a chip.

In an attempt to fabricate smaller chips having more features, manufacturers have kept reducing the wavelength of the light and increased the numerical aperture of the projection optics used to image the circuit features on a wafer. Optical proximity corrections and phase shifting techniques have been widely adopted in mask pattern generation to improve resolution. With critical dimensions of some features now significantly less than half of a wavelength and the currently used numerical aperture being close to one, further miniaturization may become increasingly difficult.

SUMMARY OF THE INVENTION

According to one embodiment of the invention, a method for enhancing multiple feature lithography is provided. The method includes generating a plurality of maps each associated with a particular one of a plurality of circuit features. Each map maps an illumination field comprising a plurality of point sources and indicates, in terms of a process metric and for each point source, a level of feature quality that will result from using the each point source to image the each circuit feature. The method also includes identifying, based on the maps, a group of one or more of the point sources that, if used to image the circuit features onto a target surface, will result in an overall feature quality level equal to or greater than a predetermined quality threshold.

Some embodiments of the invention provide numerous technical advantages. Other embodiments may realize some, none, or all of these advantages. For example, according to one embodiment, an optimization process for an illumination system is improved by modeling the quality of the final representation of each feature to be imaged and, using the quality models, selecting point sources that are acceptable for imaging all the features. According to another embodiment, the exposure capability of an illumination system is improved by imaging features through point sources that are selected based on a predicted quality of the final representation of each feature to be imaged on a target substrate.

Other advantages may be readily ascertainable by those skilled in the art.

BRIEF DESCRIPTION OF THE DRAWINGS

Reference is now made to the following description taken in conjunction with the accompanying drawings, wherein like reference numbers represent like parts, in which:

FIG. 6 is a flow chart illustrating one embodiment of a method for determining a common solution that may be used in conjunction with the method of FIG. 2.

DETAILED DESCRIPTION OF EXAMPLE EMBODIMENTS OF THE INVENTION

Embodiments of the invention are best understood by referring to FIGS. 1A through 6 of the drawings, like numerals being used for like and corresponding parts of the various drawings.

Figure 1A:
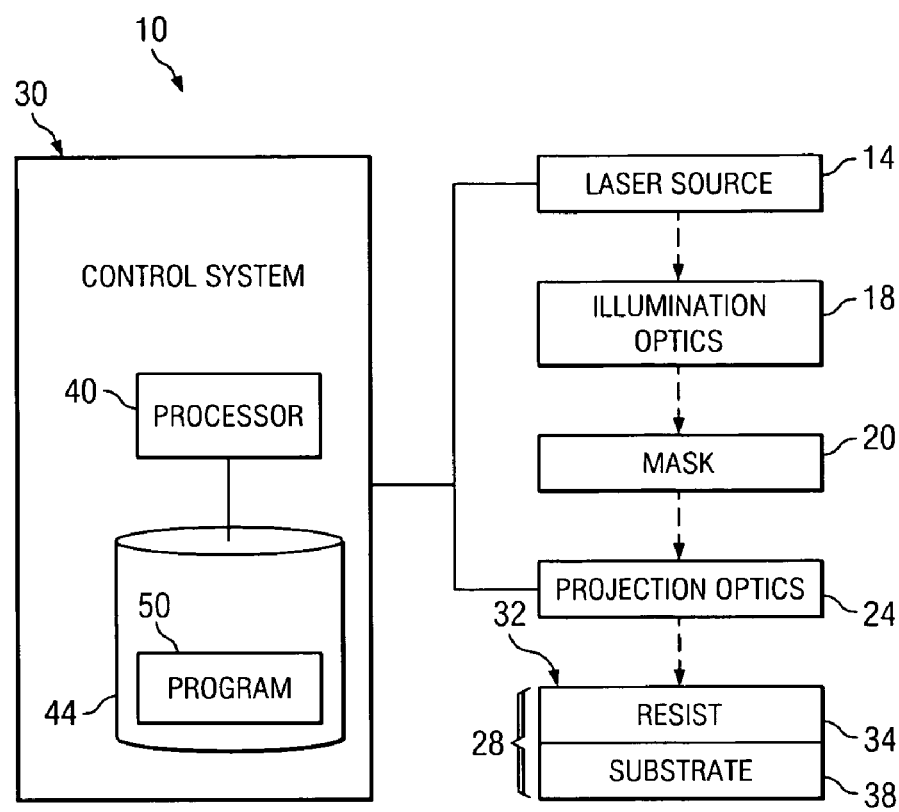
FIG. 1A is a schematic diagram illustrating one embodiment of an illumination system that may benefit from the teachings of the present invention.

FIG. 1A is a schematic diagram illustrating one embodiment of a projection lithography system 10 that may benefit from the teachings of the present invention. Projection lithography system 10 includes a laser source 14, an illumination optics 18, a mask 20, a projection optics device 24, a wafer 28, and a control system 30. Wafer 28 comprises a resist layer 34 overlying a substrate 38. Control system 30 comprises a processor 40 coupled to a memory 44 storing a control program 50.

Laser source 14 is operable to provide a suitable beam of laser at a particular wavelength to illumination optics 18. Illumination optics 18 is operable convert the laser beam to a partially coherent light source of certain shapes for illuminating mask 20. Mask 20 models a plurality of features to be etched onto a target surface, such as a target surface 32 of wafer 28. An example of a feature is a trench. The light that passes through mask 20 is diffracted by the pattern of mask 20. The light diffracted by mask 20 is received by projection optics 24.

Projection optics 24 is operable to collect the diffracted light and project the collected light onto target surface 32. The collection capability of projection optics 20 is indicated by a value referred to as a "numerical aperture" or "NA." A numerical aperture value of "1" represents 100 percent collection of diffracted light from mask 20; however, the definition of NA may be altered so that the NA value is greater than "1" in case of immersion. When the images of features are projected onto surface 32 of resist layer 34, a chemical reaction occurs on resist 34 that allows subsequent processing steps to be taken in order to fabricate the features onto substrate 38, as well known in the art. Control system 30 is operable to control the control variables of laser source 14 and projection optics 24 by executing the instructions of program 50 using processor 40.

Figure 1B:
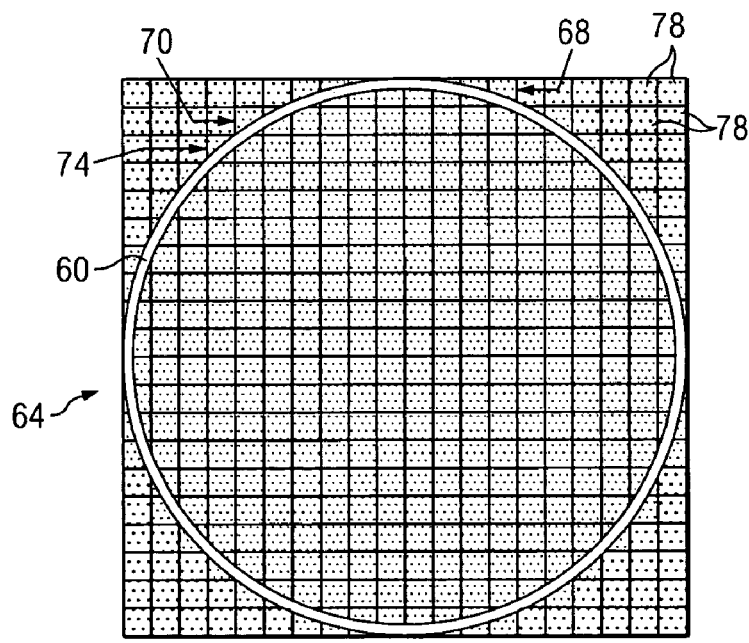
FIG. 1B is a schematic diagram illustrating one embodiment of an illumination field that represents the available spatial extension of the illumination source at the exit pupil of the projection optics shown in FIG. 1A.

FIG. 1B is a schematic diagram illustrating one embodiment of an illumination field 64 that represents the available spatial extension of illumination source 18 (shown in FIG. 1A) at the exit pupil of projection optics 24 (shown in FIG. 1A), also referred to as pupil fill. As shown in FIG. 1B, illumination field 64 comprises a circular boundary 60 and a plurality of point sources 78 shown as squares 78. Boundary 60 defines the exit pupil of projection optics 24. An illuminator of an arbitrary shape is typically represented by an assembly of discrete point sources 78 in a mathematical treatment of partially coherent imaging. In some cases, each point source 78 may be identified using a unique identifier. For example, a row 68 of point sources 78 may be identified as "A1" through "A6," respectively. A row 70 of point sources 78 may be identified as "B1" through "B12," respectively. A row 74 of point sources 78 may be identified as "C1" through "C14," respectively, and so on. Control system 30 shown in FIG. 1A is operable to control illumination optics 18 so that certain portions of point sources 78 may be used to image the features onto target surface 32. Using different point sources 78 in illumination field 64 may result in different image quality for different features. For example, feature "A" with a particular design rule may have a higher image quality at point sources 78 identified as "A1" through "A4", but a lower image quality at point sources 78 identified as "C4" through "C10." However, feature "B" with a different design rule than feature "A" may have a higher image quality at point sources 78 identified as "C1" through "C7", but a lower image quality at point sources 78 identified as "A1" through "A6."

Miniaturization of chips generally involves decreasing the wavelength of light used to image the features and using higher numerical apertures. However, with critical dimensions of some features now less than a wavelength and the currently used numerical aperture being close to one, further miniaturization using adjustment of wavelength and/or numerical aperture may become increasingly difficult. While it is possible to further improve the pattern capability of a current lithography system by imaging the features using selected portions of an illumination field (also referred to as an "optimization of illumination system"), the empirical selection process requires multiple rounds of trial-and-error iterations. Further, exploring the entire parameter space that includes optics, mask, and resist variables to select an optimal portion of an illumination field for a plurality of features may require a significant number of experiments, which makes the empirical search for an optimal lithography solution very difficult.

According to one embodiment of the present invention, a method and system for improved optimization of an illumination system for multiple feature lithography is provided. In one embodiment, an optimization process for an illumination system is improved by modeling the quality of the final representation of each feature to be imaged and, using the quality models, selecting point sources that are acceptable for imaging all the features. According to another embodiment, the pattern capability of an illumination system is improved by imaging features through point sources that are selected based on a predicted quality of the final representation of each feature to be imaged on a target substrate.

Figure 2:
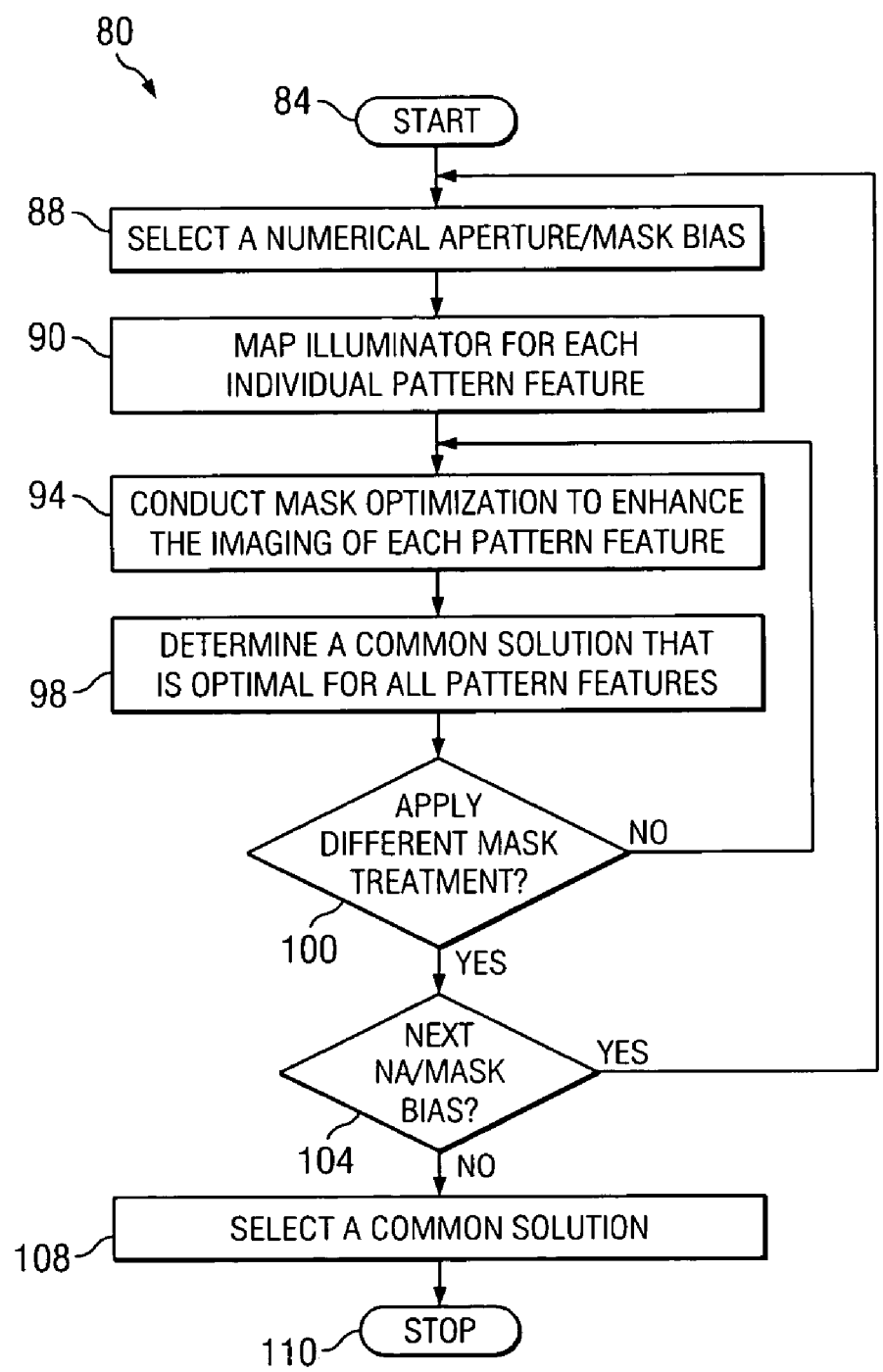
FIG. 2 is a flow chart illustrating one embodiment of a method for enhancing multiple feature lithography.

FIG. 2 is a flow chart illustrating one embodiment of a method 80 of enhancing an optimization process of multiple feature lithography. FIGS. 3A through 4B respectively show maps 120, 130, 140, 160, and 170 indicating the quality of a circuit feature predicted for each point source 78 within boundary 60. Maps 120, 130, and 140 FIGS. 3A-3C indicate the predicted feature quality of the same circuit feature, but in terms of different quality categories. Maps 160 and 170 of FIGS. 4A and 4B indicate the predicted feature quality of different circuit features, but in terms of the same quality category. In general, the predicted feature quality indicates one aspect of how closely a representation of a feature would model the actual feature. The predicted feature quality can be expressed in different aspects or quality categories, also referred to as "metrics." A metric is described in greater detail below. FIGS. 2, 3A-3C, 4A, and 4B are described together. Referring back to FIG. 2, some or all acts of method 80 may be implemented using a program that is operable to be executed by a processor of a computer. In one embodiment, one or more computers may be used to implement some or all of the acts of method 80.

Method 80 starts at step 84. At step 88, a NA for projection optics device 24 is selected. For example, where projection optics device 24 has a numerical aperture capability of 0.8 to 0.96, any numerical aperture within that range may be selected at step 88. At step 90, the pupil fill—as represented by boundary 60 shown in FIG. 1B—is mapped for each pattern feature. The mapping is performed by determining the contribution of each point source 78 to image quality—as defined by a certain category of predicted feature quality—across the exit pupil of projection optics 24. The determination of the contribution level may be accomplished using a suitable modeling technique well known to one skilled in the art. The resulting map shows which part of illuminator is desirable for a higher quality imaging.

The mapping is performed for all features to be imaged, and for one or more categories of feature quality. A category of feature quality is also referred to as a metric. An example of a metric is depth of focus (DOF) metric. The DOF metric indicates a range of depth in which a feature may be imaged at an acceptable level of focus. A map, such as map 120 shown in FIG. 3A, that is generated using the DOF metric indicates the DOF for a particular circuit feature that would result if the circuit feature were imaged through each point source 78 in boundary 60 of illumination field 64 (shown in FIG. 1B). Such a map may also be referred to as a DOF map.

Another example of a metric is a mask error enhancement factor (MEEF) metric. The MEEF metric indicates a margin of error between the representation of a feature on a mask and the actual image of the feature that is projected onto target surface 32. A map, such as map 130 shown in FIG. 3B, that is generated using the MEEF metric indicates the MEEF for a particular circuit feature that would result if the circuit feature were imaged through each point source 78 in boundary 60 of illumination field 64 (shown in FIG. 1B). Such a map may also be referred to as a MEEF map.

Another example of a metric is a cross-chip linewidth variation (ACLV) metric. The ACLV metric indicates, for each point source 78, the size difference between features that are intended to have the same size across a given length of a chip. A map, such as map 140 shown in FIG. 3C, that is generated using the ACLV metric indicates the ACLV for a particular circuit feature that would result if the circuit feature were imaged through each point source 78 in boundary 60 of illumination field 64 (shown in FIG. 1B). Such a map may also be referred to as an ACLV map.

The three example types of metrics—DOF, MEEF, ACLV—in conjunction with other quality categories that account for the characteristics of target surface 32, such as chemistry of resist layer 34 shown in FIG. 1A, are referred to as "process metrics." Process metrics indicate the predicted feature quality of the final representation of the features formed in resist layer 34. In one embodiment, process metrics may be generated using empirical data associated with wafer 28 shown in FIG. 1A as well known by one skilled in the art. Process metrics, such as DOF, MEEF, ACLV metrics, as well as optical proximity correction (OPC) metric and exposure latitude (EL) metric, accounts for the resist factor and thus may be better suited for predicting the actual imaging capability on target resist 34.

Figure 3A:
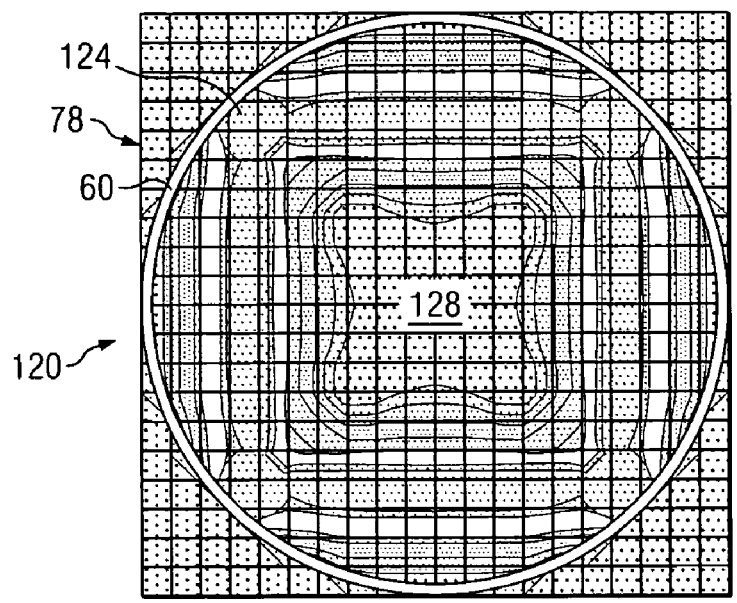
FIGS. 3A through 3C are schematic diagrams each illustrating a map that may be used in conjunction with the method of FIG. 2.
Figure 3B:
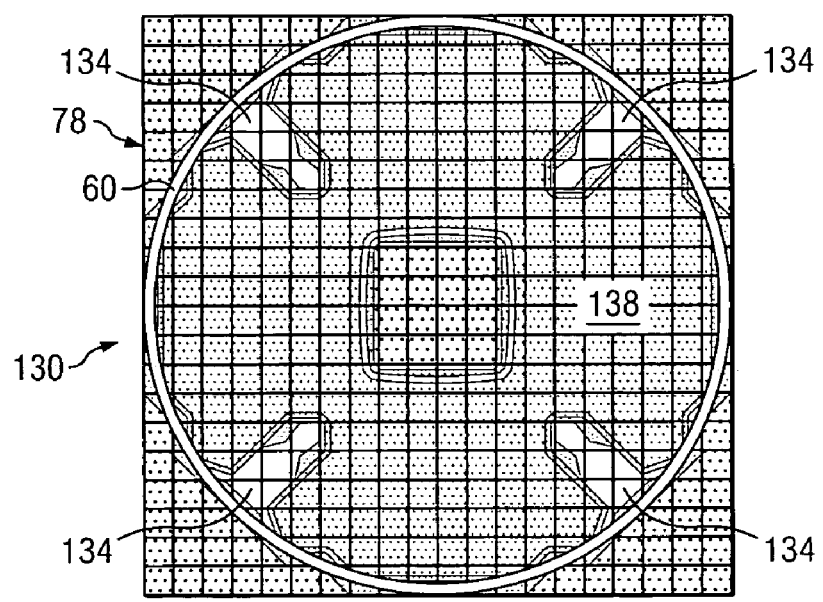
Figure 3C:
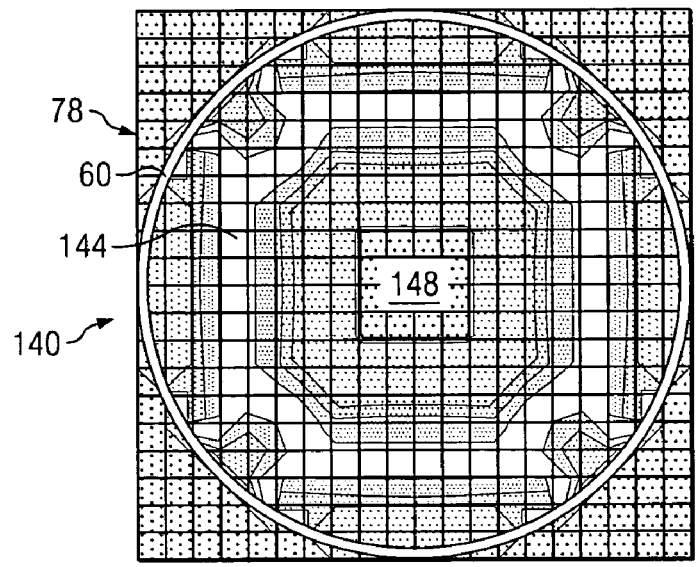

Referring again to step 90 of FIG. 2, examples of maps that may be generated at step 90 are shown in FIGS. 3A-3C. FIG. 3A shows DOF map 120 of a feature. As shown in FIG. 3A, map 120 comprises boundary 60 within which each point source 78 is associated with an indication of DOF for a feature. Map 120 also comprises a plurality of areas, such as areas 124 or 128. Each area indicates a particular level of predicted feature quality and is distinguishable from other areas by a particular pattern, as shown in FIG. 3A. For example, point sources 78 in area 124 may allow a larger depth of focus for a particular feature than point sources 78 in area 128.

FIG. 3B shows an example of MEEF map 130. As with DOF map 120 shown in FIG. 3A, MEEF map 130 comprises boundary 60 within which the pattern sensitivity to mask error associated with each point source 78 is indicated. For example, as shown in FIG. 3B, point sources 78 in areas 134 may offer a relatively lower sensitivity to mask error than point sources 78 in area 138 for the particular feature to be imaged.

FIG. 3C shows an example of ACLV map 140. As with maps 120 and 130 shown in FIGS. 3A and 3B, respectively, ACLV map 140 includes boundary 60 within which a level of linewidth uniformity for a feature is indicated for each point source 78. For example, as shown in FIG. 3C, point sources 78 in an area 144 may allow a relatively better size uniformity for the particular dimensions of the feature to be imaged than point sources 78 in area 148. In a more specific example, in a hypothetical situation where a feature to be imaged has a gate length of 70 nanometers, imaging the feature using point sources 78 in area 144 may result in a linewidth error of +/− two nanometers across a two millimeter die. However, if point sources 78 in area 148 are used, a linewidth variation of +/− six nanometers or bigger may result for the feature represented in resist layer 34 shown in FIG. 1A.

Referring again to FIG. 2, although process metrics are used as example metrics for the mapping of step 90, in some embodiments, optical metrics may be used at step 90. An optical metric indicates the predicted quality of an optical image of a feature that is projected on a target surface. The quality of image in an optical metric is influenced by optical settings of a projection lithography system 10 shown in FIG. 1A, such as illumination optics 18 and projection optics 24. For example, the quality of image may be adjusted by controlling the wavelength of light from light source 14, polarization, and any other suitable techniques. An example of an optical metric may be a normalized image log slope (NILS) metric, which indicates the contrast of image for each point source 78 shown in FIG. 1B.

At step 94, mask optimization may be conducted to improve the pupil fill (PF) number associated with each map generated at step 90. PF number indicates a percentage of point sources within the entire available illumination source that meets a particular quality threshold associated with the particular category of metric. For example, if half of point sources 78 in ACLV map 140 shown in FIG. 3C allows six nanometers or less of error, and the predetermined quality standard is six nanometers, then the PF number for the ACLV map 140 is 0.5, or 50 percent. Higher PF number indicates better pattern quality.

Referring back to step 94, in one embodiment, the size of the mask feature that represents the feature to be imaged may be adjusted at mask 20 (shown in FIG. 1A) as a part of the mask optimization process. In another embodiment, as a part of the mask optimization process, mask 20 may be modified using any suitable method to manipulate the phase and transmission of the light that passes through mask 20 to increase the contrast of the image. In another embodiment, assist features are placed on mask 20 to help modulate the diffraction light. For example, sub-resolution assist features may be placed on mask 20 to help modulate the diffraction light. These and any other suitable enhancement techniques associated with mask 20 may be used to improve the pupil fill number of one or more maps generated at step 90. Although the examples of different mask optimization techniques have been described above, any other mask enhancement techniques to improve the PF number of maps generated at step 90 may be used to conduct the mask optimization process of step 94. In some embodiments, step 94 may be omitted.

Figure 4A:
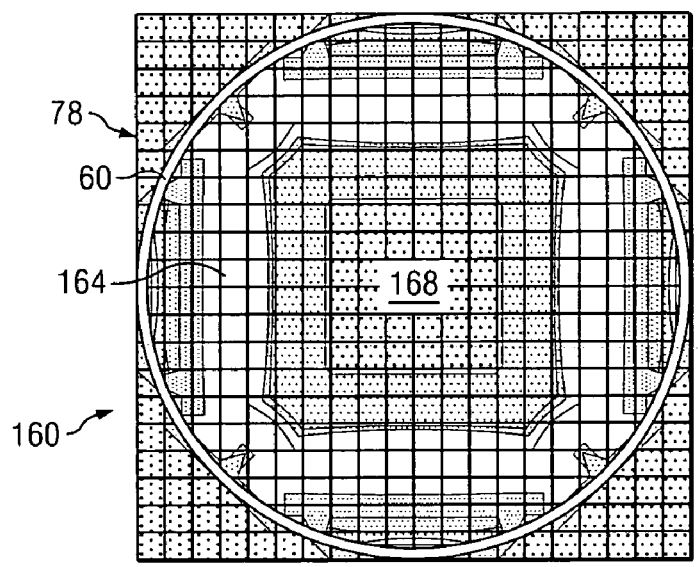
FIGS. 4A and 4B are schematic diagrams each illustrating a map that may be used in conjunction with the method of FIG. 2.
Figure 4B:
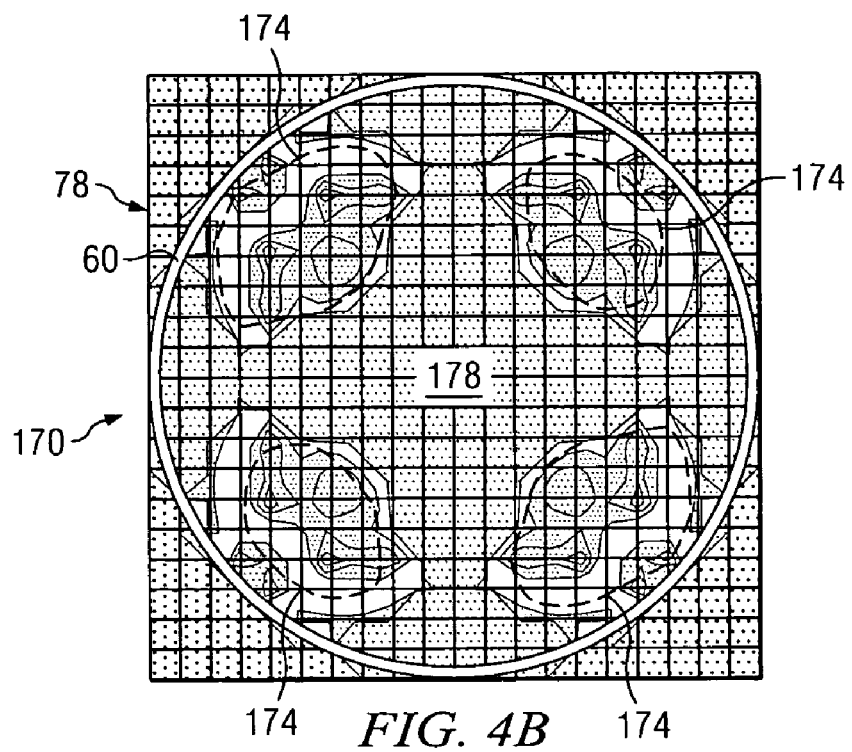
Figure 5:
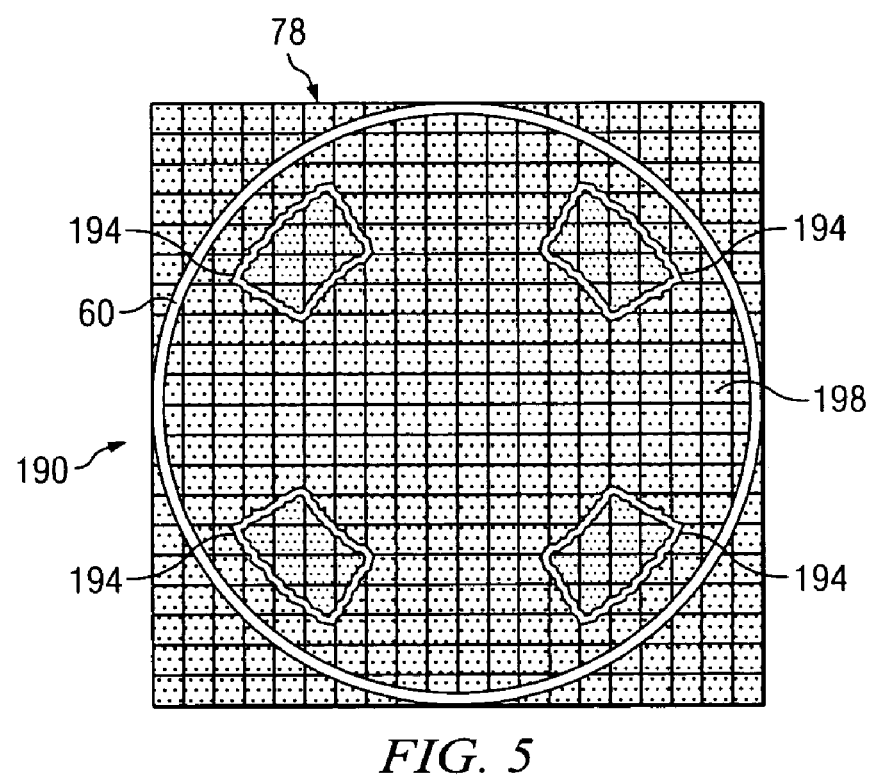
FIG. 5 is a schematic diagram illustrating one embodiment of a set of point sources that constitutes a common solution that may be obtained using the maps shown in FIGS. 4A and 4B.

At step 98, a set of point sources 78 that constitutes an acceptable common solution for all features to be imaged is determined. In some embodiments, an optimal common solution is determined at step 98. In one embodiment, a common solution may be determined by selecting some of point sources 78 that indicate an acceptable predicted feature quality for each metric and for each feature. For example, as respectively shown in FIGS. 4A and 4B, ACLV maps 160 and 170 are associated with two different features to be imaged. Maps 160 and 170 each show different areas having different ACLVs within boundary 60. For example, point sources 78 in an area 164 may offer a lower error margin than point sources 78 in an area 168. As shown in FIG. 4B, point sources 78 in area 174 may offer a lower error margin than point sources 78 in area 178. Thus, in a hypothetical situation where point sources 78 in area 164 of FIG. 4A indicate six nanometers or less of error, point sources 78 in area 174 of map 170 shown in FIG. 4B allow an error margin of 4 nanometers or less, and the acceptable threshold level of ACLV is six nanometers or less, the point sources 78 that are in both areas 164 (shown in FIG. 4A) and 174 (shown in FIG. 4B) may be selected as a group 194 of point sources 78 (shown in FIG. 5) that constitutes an acceptable common solution for both of the features mapped by maps 160 and 170 shown in FIGS. 4A and 4B, respectively. In some embodiments, a common solution may be determined using a computerized algorithm. Additional details regarding a computerized determination of the common solution are provided below in conjunction with FIG. 6.

Referring back to FIG. 2, at decision step 100, whether a different mask treatment should be applied is determined. In some embodiments, this determination may be based on a determination of whether an acceptable common solution exists. If no, then the "no" branch is followed to step 94. In some embodiments where step 94 is omitted, method 80 instead proceeds to step 104. If yes, then the "yes" branch is followed to step 104. At step 104, in one embodiment, another numeric aperture may be selected to determine a common solution, and the level of light exposure may be varied. If another numerical aperture and/or level of exposure is to be used, then the "yes" branch is followed to step 88. If no, then "no" branch is followed to step 108. At step 108, if applicable, a common solution is selected from a plurality of common solutions. Method 80 stops at step 110.

FIG. 6 is a flow chart illustrating one embodiment of a method 200 for determining a common solution at step 98 of method 80 shown in FIG. 2. Method 200 may be implemented as a hardware or software program that may be executed using a processor of a computer. However, any suitable method may be used to implement method 200.

At step 204, a starting set of point sources 78 that constitutes an illumination source is identified based on the mapping results of step 90 of FIG. 2. The identification of the starting set at step 204 may be based on one or more criteria. For example, DOF may be used to select point sources 78 that are above a certain threshold, as determined by one skilled in the art. All of the point sources 78 selected from the map of each feature are combined into one map and used as the starting source shape. In some embodiments, the criterion may be set low enough so that all source points 78 qualify as the starting set.

At step 208, depending on the metric to be improved (DOF, for example), a cost function or a merit function is defined and evaluated. An example of a cost function is the minimum of ACLV of multiple pattern features. An example of a merit function is the maximum of DOF of multiple pattern features. The cost function is used for metrics, such as ACLV and MEEF, where a lower value indicates better predicted quality and a higher value indicates worse predicted quality. The merit function is used for metrics, such as NILS and DOF, where a higher value indicates better predicted quality and a lower value indicates worse predicted quality.

At step 210, a contribution value (C.V.) is calculated and evaluated for each point source 78 in the set. C.V. indicates an overall impact a particular point source has on the image quality of all the features. In one embodiment, the contribution value of each point source 78 may be determined using the following equation:

$$C.V.i = \Sigma(\text{impact} * \text{weight})$$

where, the summation is over all pattern features of interest. "i" indicates a particular point source, such as point source 78. "Impact" indicates a level of impact on the image quality of a feature in terms of a specific metric used in the evaluation, calculated against the current set. "Weight" indicates a level of importance depending on the impact on the predicted feature quality. A larger weight value is assigned when the impact is more negative through a mathematical function such as exponential or power law. The determination of the "impact" and "weight" values are well known by one skilled in the art.

At step 214, point sources 78 in the set are ranked by their respective C.V. values. Point sources 78 may be arranged from the best to the worst, from the worst to the best, or in any other suitable arrangement. At step 218, a new set of point sources 78 that constitutes an illumination source is identified by excluding at least one point source 78 using a predetermined standard. In some embodiments, one or more point sources 78 that are ranked as having the lowest C.V. on the overall image quality are excluded. In some embodiments, using the ranking, the worst point source 78 may be excluded. However, any point source 78 that is ranked as having a negative impact on the image quality may be excluded. For example, a predetermined threshold C.V. may be used to exclude at least one point source 78 that does not meet the predetermined threshold C.V.

At step 220, a cost or a merit function for the new set of point sources 78 is determined, and each point 78 in the new set is evaluated in terms of its contribution function. At decision step 222, whether there is an improvement in the cost or merit function is determined. If yes, then "yes" branch is followed to step 210. If no, then "no" branch is followed to step 224, where the set that did not result in any further improvement of the cost or merit function is identified as a common solution. Method 200 may be used for a variety of metrics, including, but not limited to, DOF, MEEF, and ACLV.

Although some embodiments of the present invention have been described in detail, it should be understood that various changes, substitutions, and alterations can be made hereto without departing from the spirit and scope of the invention as defined by the appended claims.

What is claimed is:

1. A method for enhancing multiple feature lithography, the method comprising:
   generating a plurality of maps each associated with a particular one of a plurality of circuit features, each map mapping an illumination field comprising a plurality of point sources and indicating, in terms of a process metric and for each point source, a level of feature quality that will result from using the each point source to image the each circuit feature;
   adjusting one or more characteristics of a mask representing the plurality of features to improve the feature quality; and
   identifying, based on the maps, a group of one or more of the point sources that, if used to image the circuit features onto a target surface, will result in an overall feature quality level equal to or greater than a predetermined quality threshold, the group identified by:
      calculating a contribution value for each point source, the contribution value indicating an overall impact of the each point source on the feature quality of the circuit features;
      ranking the point sources based on the respective contribution values; and
      excluding at least one point source that does not meet a predetermined rank threshold.

2. The method of claim 1, wherein the target surface comprises a resist layer, and the process metric accounts for a type of the resist layer.

3. The method of claim 1, and further comprising initiating an imaging of the circuit features onto the target surface using the adjusted mask and the group.

4. The method of claim 1, wherein the plurality of features comprises a main feature and an assist feature operable to assist the main feature, the mask having a first model of the main feature and a second model of the assist feature, and wherein adjusting one or more characteristics of the mask comprises adjusting a distance between the first model and the second model.

5. A method for enhancing multiple feature lithography, the method comprising:
   generating a plurality of maps each associated with a particular one of a plurality of circuit features, each map mapping an illumination field comprising a plurality of point sources and indicating, in terms of a process metric and for each point source, a level of feature quality that will result from using the each point source to image the each circuit feature, wherein each map indicates the level of feature quality in terms of the process metric and an optical metric; and
   identifying, based on the maps, a group of one or more of the point sources that, if used to image the circuit features onto a target surface, will result in an overall feature quality level equal to or greater than a predetermined quality threshold for the multiple feature lithography.

6. The method of claim 5, wherein the target surface comprises a resist layer, and the process metric accounts for a type of the resist layer.

7. The method of claim 5, wherein identifying the group comprises:
calculating a contribution value for each point source, the contribution value indicating an overall impact of the each point source on the feature quality of the circuit features;
ranking the point sources based on the respective contribution values;
excluding at least one point source that does not meet a predetermined rank threshold.

8. The method of claim 5, and further comprising initiating an imaging of the circuit features onto the target surface using the group.

9. The method of claim 5, wherein the feature quality indicates a level of cross-chip line width variation.

10. The method of claim 5, and further comprising initiating an imaging of the circuit features onto the target surface using the group of point sources and no other point sources of the illumination field.

11. The method of claim 5, and further comprising adjusting one or more characteristics of a mask to change the feature quality before identifying the group, the mask representing the plurality of features.

12. The method of claim 11, wherein the plurality of features comprises a main feature and an assist feature operable to assist the main feature, the mask having a first model of the main feature and a second model of the assist feature, and wherein adjusting one or more characteristics of the mask comprises adjusting a distance between the first model and the second model.

13. An apparatus for enhancing multiple feature lithography, comprising:
a computer-readable medium; and
a program stored in the computer-readable medium of the multiple feature lithography and operable, when executed using a processor of a computer, to:
generate a plurality of maps each associated with a particular one of a plurality of circuit features, each map mapping an illumination field comprising a plurality of point sources and indicating, in terms of a process metric and for each point source, a level of feature quality that will result from using the each point source to image the each circuit feature; and
identify, based on the maps, a group of one or more of the point sources that, if used to image the circuit features onto a target surface, will result in an overall feature quality level equal to or greater than a predetermined quality threshold; wherein the group is identified by:
calculating a contribution value for each point source, the contribution value indicating an overall impact of the each point source on the feature quality of the circuit features;
ranking the point sources based on the respective contribution values;
excluding at least one point source that does not meet a predetermined rank threshold.

14. The apparatus of claim 13, wherein the target surface comprises a resist layer, and the process metric accounts for a type of the resist layer.

15. The apparatus of claim 13, wherein the program is further operable to initiate an imaging of the circuit features onto the target surface using the group.

16. The apparatus of claim 13, wherein the feature quality indicates a level of cross-chip line width variation.

17. The apparatus of claim 13, wherein the program is further operable to initiate an imaging of the circuit features onto the target surface using the group of point sources and no other point sources of the illumination field.

18. The apparatus of claim 13, wherein the program is further operable to adjust one or more characteristics of a mask to change the feature quality before identifying the group, the mask representing the plurality of features.

* * * * *